United States Patent [19]

Hayakawa

[11] Patent Number: 5,495,172
[45] Date of Patent: Feb. 27, 1996

[54] MAGNETIC RESONANCE IMAGING (MRI) APPARATUS EMPLOYING OPTIMUM PRE-SATURATION TECHNIQUE

[75] Inventor: Hiroshi Hayakawa, Tochigiken, Japan

[73] Assignee: Kabushiki Kaisha Toshiba, Kanagawa, Japan

[21] Appl. No.: 222,895

[22] Filed: Apr. 5, 1994

[30] Foreign Application Priority Data

Apr. 5, 1993 [JP] Japan .................................. 5-077313

[51] Int. Cl.$^6$ ............................................. G01V 3/00
[52] U.S. Cl. ......................................... 324/318; 324/322
[58] Field of Search ................................ 324/306, 307, 324/309, 312, 318, 322; 128/653.5

[56] References Cited

U.S. PATENT DOCUMENTS 5,348,012  9/1994  Kojima .................................. 324/306

FOREIGN PATENT DOCUMENTS 63-122339  5/1988  Japan .

OTHER PUBLICATIONS

"Cylindrical Cross–Coil NMR Limb Blood Flowmeter" by R. E. Halbach et al. Rev. Sci. Instum. 50(4) Apr. 1979 pp., 428–434.

Primary Examiner—Louis M. Arana
Attorney, Agent, or Firm—Limbach & Limbach; Ronald L. Yin

[57] ABSTRACT

A magnetic resonance imaging apparatus capable of freely performing the presaturation in a wide-range region over the excited region of the transmit/receive coil and also capable of sufficiently suppressing the blood-flow artifact and the motion artifact to a minimum. The magnetic resonance imaging (MRI) apparatus includes: a static magnetic field generating unit; a gradient magnetic field generating unit where the gradient magnetic field is overlapped to the static magnetic field; a sequencer for executing a desired pulse sequence, in which the pulse sequence includes a main sequence that detects a magnetic resonance signal, and a pre-saturation sequence that saturates magnetization in a biological body under medical examination, prior to execution of the main sequence; first radiofrequency (RF) coil for transmitting a high frequency magnetic field to the biological body according to the main sequence; and second (RF) coil for transmitting a high frequency magnetic field to perform pre-saturation according to the presaturation sequence.

8 Claims, 2 Drawing Sheets

MAGNETIC RESONANCE IMAGING (MRI) APPARATUS EMPLOYING OPTIMUM PRE-SATURATION TECHNIQUE

BACKGROUND OF THE INVENTION

1. Technical Field

The present invention relates to a magnetic resonance imaging apparatus with an improved capability for use with a presaturation operation.

2. Background Art

In magnetic resonance phenomenon, the nucleus of an atom whose spin is not zero and which has a magnetic moment in a static magnetic field, absorbs and emits a specific electromagnetic wave resonantly. The nucleus resonates with an angular frequency $\omega_o$ shown in the following Larmor equation which is an equation defining the resonance condition including a relationship between the Larmor frequency $\omega_o$, the gyromagnetic ratio $\gamma$ and the static magnetic field strength $H_o$.

$$\omega_o = \gamma . H_o,$$

where $\omega_o = 2\pi v_o$ in which $v_o$ represents Larmor frequency. The Larmor frequency $v_o$ is a resonance frequency defined by the Larmor equation.

In accordance with an apparatus utilizing the above principle, the electromagnetic wave that is induced after the above resonance absorption and has a same frequency with the above, are received by a receiver coil and then signal-processed. Thereafter, diagnosis data which reflects a nuclear density, a longitudinal magnetic relaxation time $T_1$, a transverse magnetic relaxation time $T_2$, a flow, a chemical shift and so on are obtained without cutting an object to be examined, in particular, a slice image data of a biological body under medical examination is conveniently obtained.

In acquiring the diagnosis data by means of a nuclear magnetic resonance, a whole area of the biological body placed in the static magnetic field is excited and signal-acquired. However, on account of a limitation due to a structure of the apparatus and a clinical need for imaging data, a specific region is excited in real practice and is signal-acquired for the specific region.

In this case, the specific imaging region is, in general, a slice portion having a certain thickness. A nuclear magnetic resonance (NMR) signal such as an echo signal or FID signal from the slice portion is obtained by executing a data-encode process for plural times. The stands for Free Induction Decay which is an observed NMR signal following termination of the radiofrequency (RF) pulse, similar in shape to a damped sine wave. A group of such data is, for example, image-reconstructed by a second-dimensional Fourier transformation (2DFT) technique, so as to generate an image for the slice portion.

In the above-described MRI apparatus, a presaturation technique is performed in order to suppress a blood-flow artifact and motion artifact. As described in Japanese Patent Application Laid-Open 63-122439, the presaturation is performed prior to an imaging of the slice portion. An adjacent region that has a prescribed thickness and is positioned parallel to the slice portion, is selectively excited by a $\pi/2$ pulse so that a transverse magnetic component of that region is eliminated. As other techniques, there is available a method in which a surface orthogonal to the slice portion is presaturated. Conventionally, in the course of performing the presaturation, there are utilized a gradient magnetic field coil and a transmitter coil or transmit/receive (transceiver) coil. In recent years, the transmitter coil or the transmit/receive coil tends to be designed functionally and compact-sized in order to improve a S/N ratio therefor. Moreover, referring to FIG. 1, there are provided presaturation-use slices 4, 5 in upper end and lower end portions of the transmit/receive coil 1 such as a head coil and knee coil, respectively. There are also provided data-acquiring multi-slices 6 between the presaturation-use slices 4, 5.

However, in above type of transmitter coil or transmit/receive coil, particularly in the transmit/receive coil, the coil is so compact-sized that the region to be excited by the coil is very limited. In other words, since the transmit/receive coil 1 is so compact-sized that the excitation efficiency by the radiofrequency (RF) pulse is deteriorated in both the upper end portion 2 and the lower end portion 3 of the coil 1, thus the presaturation being not fully satisfactorily performed. Moreover, since the upper end portion and lower end portion are designated for the use with the presaturation, an image region is undesirably narrowed.

SUMMARY OF THE INVENTION

In view of the foregoing drawbacks, it is therefore an object of the present invention to provide a magnetic resonance imaging apparatus capable of freely performing the presaturation in a wide-range region over the excited region of the transmit/receive coil and also capable of sufficiently suppressing the blood-flow artifact and the motion artifact to a minimum.

To achieve the object, there is provided a magnetic resonance imaging (MRI) apparatus comprising: static magnetic field generating means for generating a static magnetic field; gradient magnetic field generating means for generating a gradient magnetic field that is overlapped to the static magnetic field; sequencer means for executing a desired pulse sequence, in which the pulse sequence includes a main sequence that detects a magnetic resonance signal, and a pre-saturation sequence that saturates magnetization in a biological body under medical examination, prior to execution of the main sequence; first radiofrequency (RF) coil means for transmitting a high frequency magnetic field to the biological body according to the main sequence; and second radiofrequency (RF) coil means for transmitting a high frequency magnetic field to perform pre-saturation according to the presaturation sequence.

BRIEF DESCRIPTION OF THE DRAWINGS

These and other objects, features and advantages of the present invention will become more apparent from the following description of the preferred embodiment taken in conjunction with the accompanying drawings, in which.

It is to be noted that the figures attached in this specification are made only for an illustrative purpose. The imaging region and presaturation region may not be correctly drawn, since the surface or region in question may vary according to situation on demand including a gradient or transverse surface and the like.

DETAILED DESCRIPTION OF THE PREFERRED EMBODIMENTS

Features of the present invention will become apparent in the course of the following description of exemplary embodiments which are given for illustration of the invention and are not intended to be limiting thereof. Embodiments of the present invention will now be described with reference to the drawings.

Figure 1:
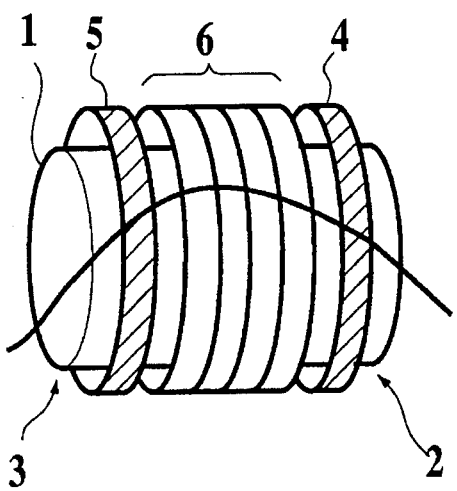
FIG. 1 illustrates a coil portion of MRI apparatus in the conventional practice.
Figure 2A:
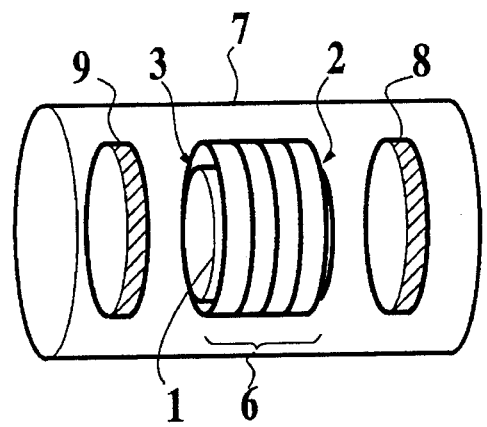
FIG. 2A illustrates a coil portion of the MRI apparatus according to an embodiment of the present invention.
Figure 2B:
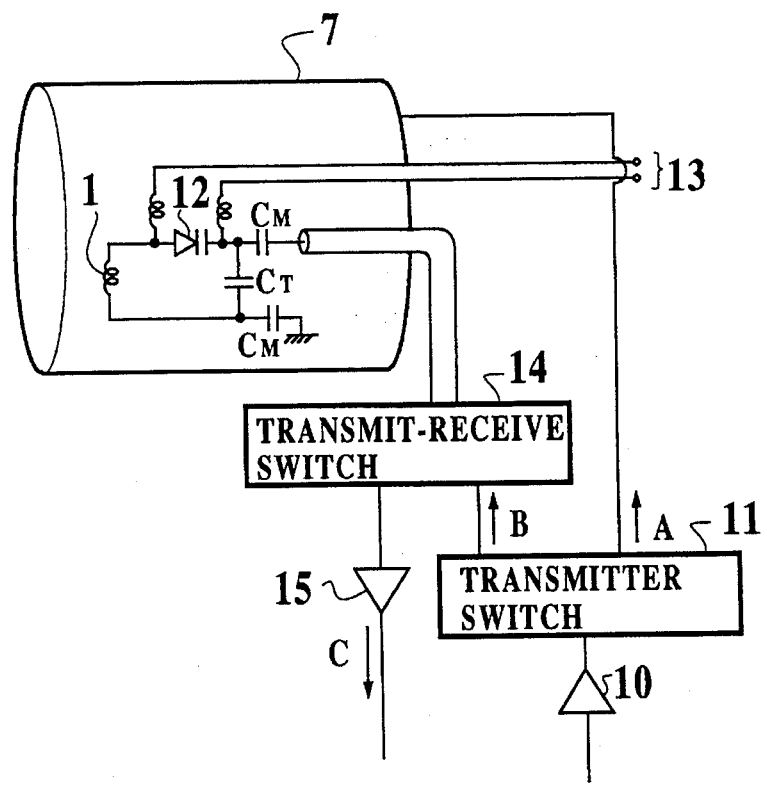
FIG. 2B shows a schematic diagram including a control circuit configuration for the coil portion shown in FIG. 2A.

FIG. 2A is a brief perspective view of a coil portion of a magnetic resonance imaging (MRI) apparatus according to a preferred embodiment of the present invention. FIG. 2B is a control circuit for the MRI apparatus shown in FIG. 2A. In FIG. 2A, the reference numeral 1 denotes a knee coil serving as a transmit/receive coil, and imaging-use multiple slices are provided over an almost whole region of the knee coil 1. On the other hand, in a whole-body coil 7, there are provided selective excitation regions 8, 9 with use for performing presaturation. The selective excitation regions 8, 9 are situated adjacent to an upper end portion 2 and a lower end portion 3 of the knee coil 1, respectively. Therefore, the region covered by the knee coil thus provided can be set as the imaging region (imaging-use multi slices). Presaturation slices can be freely chosen in a wide range, which is free from the knee coil 1. It is to be noted that a S/N ratio therefor is not deteriorated. This is because the knee coil 1 (transmit/receive coil) becomes bigger, in size, by including the presaturation slices in the coil effective region. A range in which the presaturation is covered, can be enlarged in the effective range of the knee coil 1 (transmit/receive coil).

As described above, the whole-body coil 7 is utilized for performing the presaturation. In other words, a different coil from the imaging-use coil 1 is utilized so that the presaturation can be effectively performed.

In that case, it may be necessitated that the whole-body coil 7 for use with presaturation and the transmit/receive coil 1 for use with imaging be decoupled. In order to achieve the decoupling, there is provided a decoupling mechanism including a pin diode, in the transmit/receive coil 1 for use with imaging.

Next, a principle as to why the decoupling is necessary will be described herein. When two coils are provided adjacent to each other, a magnetic flux of one coil may induce another magnetic flux to tie formed in the other coil as well. This mutual relation between two coils or circuits are called a coupling. Thus, functional independency for the two coils are achieved in a manner that when one coil is switched ON, the other coil is switched OFF. Thereby, transfer or feedback of the magnetic flux from one coil to other is prevented by the decoupling. In this embodiment, first, a presaturation radiofrequency (RF) pulse in a presaturation region of the whole body coil 7 Is switched ON. After the the presaturation RF pulse is switched OFF, a transmit RF pulse for use with imaging Is switched ON. With reference to FIG. 2B, a control circuit or a decoupling circuit for the coil 1 will be described in detail.

In FIG. 2B, in the event that the presaturation is performed, a presaturation RF pulse having passed an RF-pulse amplifier 10 is switched by a transmitter switch 11 and is transferred to the whole-body coil 7 as indicated by arrow mark A, so that regions 8, 9 shown in FIG. 2A are selectively excited by the whole-body coil 7. Then, the transmit/receive knee coil 1 is synchronized to the presaturation RF pulse by decoupling lines 13 including the pin diode 12, so as to be under a state of the decoupling, thereby not to interfere with the excitation due to the RF pulse. When an imaging process is performed after the presaturation process, a transmit RF pulse is switched by the transmitter switch 11 and is transferred to the transmit/receive switch 14 as indicated by arrow mark B. Then the pulse is transferred to the knee coil 1, and excites a patient's multi slice location for imaging. In this case, a decoupling control line (not shown) is controlled so that a side of the whole-body coil 7 does not take part in interfering with the excitation of the knee coil. Thus obtained receive signal is transferred from the knee coil 1 to the transmit/receive switch 14 with a receiver switch being activated and is fed to a receiver unit in a direction indicated as arrow mark C, through a preamplifier 15 so as to be image-processed.

Accordingly, a currently available whole-body coil 7 is employed as the presaturation coil, without newly providing a coil for the presaturation. Moreover, there is an advantageous aspect where a region for the presaturation to be performed can be freely provided in a wide range.

Figure 3:
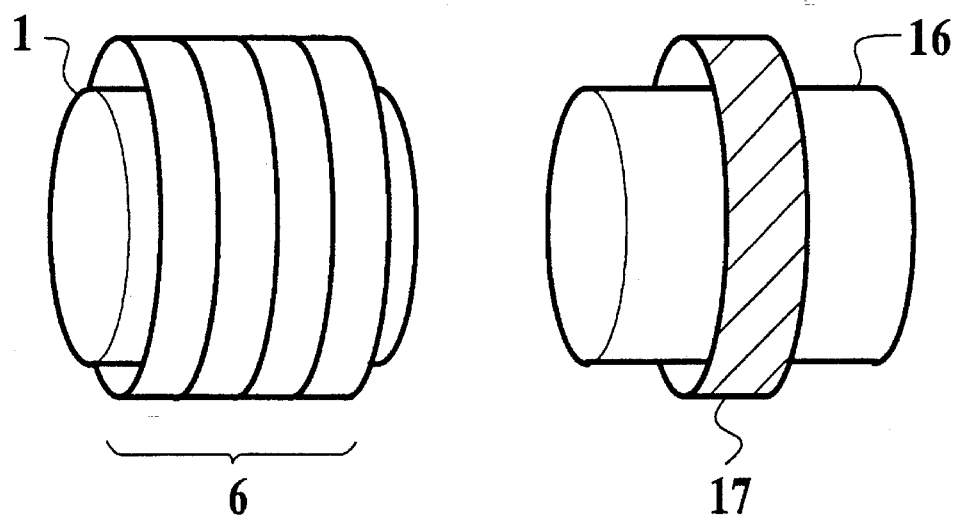
FIG. 3 illustrates a coil portion of the MRI apparatus according to another embodiment, where there is separately provided a coil 16 for use with the presaturation, in addition to the transmit/receive coil 1 for use with the imaging.

FIG. 3 shows a coil portion of the magnetic resonance imaging apparatus according to another preferred embodiment of the present invention. In this another embodiment, there is separately provided a coil 16 for use with the presaturation, in addition to the transmit/receive coil 1 for use with the imaging. The separately provided coil for use with the presaturation is of approximately the same size as the transmit/receive coil 1.

As a result thereof, the imaging multi slices 6 can be provided over an entire region of the transmit/receive coil 1 for use with the imaging. Moreover, a region to be presaturated can be arbitrarily chosen within a range of a presaturation-use coil 16. Moreover, by decreasing the size or dimensions of the coil 16 for use with the presaturation, a power necessary for generating the RF pulse for use with the presaturation can be minimized. At the same time, the imaging multi slices may be increased. Moreover, the imaging coil 1 need not include a presaturation surface, so that the coil 1 can be further compact-sized to improve the S/N ratio. This technique exhibited in the second embodiment will be convenient and effective for performing the presaturation over a specifically limited area.

Figure 4:
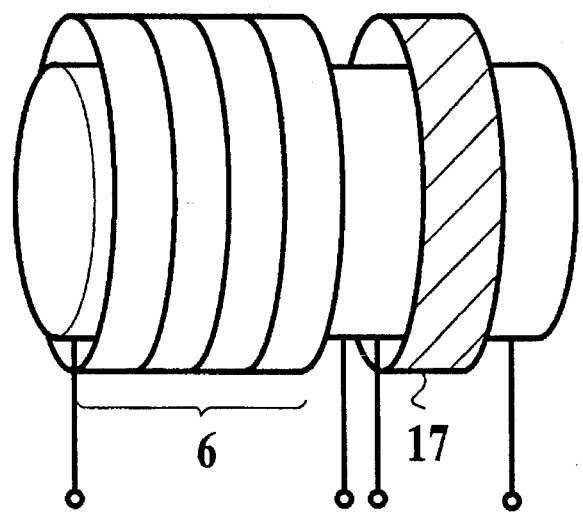
FIG. 4 shows still another embodiment, where a single coil is functionally divided into two parts, in which one part is the transmit/receive coil 1 for use with imaging and another part is the presaturation-use coil 16.

FIG. 4 shows still another embodiment, where a single coil is functionally divided into two parts, in which one part is the transmit/receive coil 1 for use with imaging and another part is the presaturation-use coil 16. In terms of the above second embodiment shown in FIG. 3, it may be said that the transmit/receive coil 1 for use with imaging and the presaturation-use coil 16 are configured integrally, and respective electric circuits for the imaging-use coil and the presaturation coil are separably controlled from each other. This third embodiment illustrated in FIG. 4 can have the same effect as in the above second embodiment.

As described above, since there is provided a presaturation-use coil in addition to the imaging-use coil, the imaging-use coil need not be unnecessarily enlarged, thus improving the S/N ratio. Moreover, when a time of flight technique is utilized in an MRI angiographical imaging, an excited slice surface in a wide range can be freely selected and the imaging-use coil can be down-sized, thus improving the S/N ratio.

In summary, by employing invention, there is provided a second high frequency coil for performing the presaturation, in addition to a first high frequency coil which transmits/receives for imaging. Since there is used another coil for performing the presaturation, different from the the imaging-use coil, the presaturation can be freely performed over a wide excitation range of the transmit/receive coil for use with the imaging.

Moreover, the transmitter coil or transmit/receive coil per se is not used for the presaturation. Thereby, the imaging region (multi slices) need not be undesirably reduced. Moreover, the blood-flow artifact and the motion artifact can be effectively suppressed, and the accuracy of the presaturation is improved. Moreover, since the size of the transmit/receive coil for use with the imaging need not be enlarged just to be utilized for the presaturation, the S/N ratio is not deteriorated. Moreover, by utilizing effectively the presaturation technique so as to eliminate influence of the blood flow and the motion, an average number can be decreased, thus time necessary for imaging being shortened.

It is to be noted that figures included in this specification are made only for an illustrative purpose. The imaging region and presaturation region may not be correctly drawn, since the surface or region in question may vary according to situation on demand including a gradient or transverse surface and the like.

Besides those already mentioned above, many modifications and variations of the above embodiments may be made without departing from the novel and advantageous features of the present invention. Accordingly, all such modifications and variations are intended to be included within the scope of the appended claims.

What is claimed is:

1. A magnetic resonance imaging (MRI) apparatus comprising:

static magnetic field generating means for generating a static magnetic field;

gradient magnetic field generating means for generating a gradient magnetic field that is overlapped to the static magnetic field;

sequencer means for executing a desired pulse sequence, in which the pulse sequence includes a main sequence that detects a magnetic resonance signal, and a pre-saturation sequence that saturates magnetization in a biological body under medical examination, prior to execution of the main sequence;

first radiofrequency (RF) coil means for transmitting a high frequency magnetic field to the biological body according to the main sequence;

second radiofrequency (RF) coil means for transmitting a high frequency magnetic field to perform pre-saturation according to the presaturation sequence; and a decoupling circuit provided between the first RF coil means and the second RF coil means to improve functional independence of each coil.

2. The apparatus of claim 1, wherein the first radiofrequency coil means receives a magnetic resonance signal detected by the main sequence.

3. The apparatus of claim 1, wherein the first RF coil means and the second RF coil means are configured integrally and wherein each electric circuit for the first RF coil means and the second RF coil means is separably controlled from another.

4. The apparatus of claim 1, wherein the second RF coil means is greater in size than the the first RF coil means.

5. The apparatus of claim 1, wherein a whole-body coil serves as the second RF coil means.

6. The apparatus of claim 1, wherein the main sequence is a multi slice sequence.

7. The apparatus of claim 1, wherein the first RF coil means is a local coil and the second RF coil means is a whole-body coil, and the first RF coil means is located in an effective region in the second RF coil means.

8. The apparatus of claim 1, wherein the decoupling circuit includes a pin diode.

* * * * *